(12) United States Patent
Ye

(10) Patent No.: US 11,282,862 B2
(45) Date of Patent: Mar. 22, 2022

(54) BONDING STRUCTURE OF LATERAL SIDE OF DISPLAY PANEL

(71) Applicant: Shenzhen China Star Optoelectronics Semiconductor Display Technology Co., Ltd., Shenzhen (CN)

(72) Inventor: Yanxi Ye, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 287 days.

(21) Appl. No.: 16/624,322

(22) PCT Filed: Dec. 5, 2019

(86) PCT No.: PCT/CN2019/123162
§ 371 (c)(1),
(2) Date: Dec. 19, 2019

(87) PCT Pub. No.: WO2021/027191
PCT Pub. Date: Feb. 18, 2021

(65) Prior Publication Data
US 2021/0358965 A1    Nov. 18, 2021

(30) Foreign Application Priority Data
Aug. 14, 2019  (CN) .................. 201910746908.X

(51) Int. Cl.
*H05K 1/05*     (2006.01)
*H01L 27/12*    (2006.01)
*G02F 1/01*     (2006.01)
*H05K 1/18*     (2006.01)

(52) U.S. Cl.
CPC ........ *H01L 27/1218* (2013.01); *G02F 1/0105* (2013.01); *H01L 27/1237* (2013.01); *H05K 1/05* (2013.01); *H05K 1/18* (2013.01); *G02F 2201/42* (2013.01); *H05K 2201/0338* (2013.01); *H05K 2201/10128* (2013.01)

(58) Field of Classification Search
CPC .... H05K 1/05; H05K 1/18; H05K 2201/0338; H05K 2201/10128
USPC ............................................. 361/748
See application file for complete search history.

(56) References Cited

U.S. PATENT DOCUMENTS

| | | | |
|---|---|---|---|
| 2016/0322452 A1 | 11/2016 | Tsuruoka et al. | |
| 2016/0377905 A1* | 12/2016 | Choi | G02F 1/1339 257/72 |
| 2019/0204669 A1* | 7/2019 | Lee | H01L 23/498 |
| 2019/0384089 A1* | 12/2019 | Jeon | G02F 1/136286 |

FOREIGN PATENT DOCUMENTS

| CN | 110109300 | 8/2019 |
|---|---|---|
| CN | 110119054 | 8/2019 |
| CN | 110491919 | 11/2019 |

* cited by examiner

*Primary Examiner* — Sherman Ng

(57) ABSTRACT

The disclosure provides a bonding structure of a lateral side of a display panel, including an array substrate, a color filter, an inner circuit, and a lateral circuit. By defining a through hole in a gate insulating layer, a second metal layer may be directly connected to a first metal layer, thereby reducing layers flaked off from a glass when a lateral side of the glass is edged.

5 Claims, 5 Drawing Sheets

BONDING STRUCTURE OF LATERAL SIDE OF DISPLAY PANEL

RELATED APPLICATIONS

This application is a National Phase of PCT Patent Application No. PCT/CN2019/123162 having International filing date of Dec. 5, 2019, which claims the benefit of priority of Chinese Patent Application No. 201910746908.X filed on Aug. 14, 2019. The contents of the above applications are all incorporated by reference as if fully set forth herein in their entirety.

FIELD AND BACKGROUND OF THE INVENTION

The present disclosure relates to the field of display and, more particularly, relates to a bonding structure of a lateral side of a display panel.

Side bonding technology relates to a technology that binds a chip on film (COF) to a sectional surface of a glass periphery.

To realize the side bonding technology, a circuit needs to be printed on a sectional surface of a glass to connect wires under the glass with wires of a COF. Therefore, a structure in a junction between a circuit under the glass (outer lead bond, OLB) and a circuit on a lateral surface of the glass (COF wires) has become very important.

A conventional structure in a junction between a circuit under a glass and a circuit on a lateral side of the glass are as shown in FIG. 1 and FIG. 2. Generally, the circuit under the glass includes two metal layers, namely a first metal layer 11 and a second metal layer 12. The two metal layers are connected to each other by a through hole. A first through hole 13 and a second through hole 14 are defined in a passivation layer 15, the first through hole 13 extends through the second metal layer 12 and reaches a surface of the second metal layer 12, and the second through hole 14 extends through the first metal layer 11 and reaches a surface of the first metal layer 11. Finally, a transparent electrode 16 is disposed on the first through hole 13, the second through hole 14, and the first metal layer 11 is connected to the second metal layer 12 by the transparent electrode 16.

Regarding the technical problem of printing a circuit on lateral sides of a glass, quality of side bonding technology needs to be ensured. Therefore, the lateral sides (lateral sides parallel to line Y1-Y2 as shown in FIG. 1) of the glass need to be edged during a side bonding process. As shown in FIG. 3, layers easily flake off due to a concave-convex surface of a circuit under the glass when the lateral sides of the glass are edged. Furthermore, continuing to refer to FIG. 2, a metal 17 is easy to compress the circuit under the glass due to frames applied to side bonding technology are typically very narrow and are usually accompanied with a gold-ball adhesive, thereby causing a short circuit between a transparent electrode and a transparent electrode of a color filter.

As a result, it is necessary to provide a novel bonding structure of a lateral side of a display panel to improve safety of a circuit under a glass and solve a problem that short circuiting is easy to happen in the circuit under the glass in conventional technology.

SUMMARY OF THE INVENTION

An objective of the present disclosure is to provide a bonding structure of a lateral side of a display panel. By defining a through hole in a gate insulating layer, a second metal layer and a first metal layer may be directly connected to each other, thereby reducing layers flaked off from a glass when a lateral side of the glass is edged. In addition, a passivation layer is disposed between a circuit under the glass and a transparent electrode of a color filter, which may effectively isolate a gold-ball adhesive and a conductive layer, thereby solving a problem that a short circuit is easy to occur in the circuit under the glass.

To achieve the above objective, the present disclosure provides a bonding structure of a lateral side of a display panel, including an array substrate and a color filter disposed opposite to the array substrate, an inner circuit disposed on the array substrate, and a lateral circuit perpendicular to the array substrate and connected to the inner circuit. The inner circuit includes a first metal layer and a second metal layer, and the second metal layer is disposed on and directly connected to the first metal layer.

Furthermore, the inner circuit comprises a passivation layer and a gate insulating layer. The gate insulating layer is disposed on the first metal layer and the array substrate. The gate insulating layer comprises a through hole, and the through hole exposes the first metal layer. The second metal layer is connected to the first metal layer by the through hole and the passivation layer covers the gate insulating layer and the second metal layer.

Furthermore, a width of the through hole is greater than a width of the first metal layer, and the width of the through hole is greater than a width of the second metal layer.

Furthermore, the second metal layer includes at least one barrier and a second metal body layer, the second metal body layer is disposed on the first metal layer, and the barrier is disposed in the through hole and is attached to a lateral side of the first metal layer.

Furthermore, a width of the through hole is greater than a width of the first metal layer, and the width of the through hole is less than a width of the second metal layer.

Furthermore, a gap is defined beside a lateral side of the first metal layer away from the through hole, the second metal layer is disposed on the gate insulating layer and the first metal layer. and the second metal layer fills the gap. The second metal layer comprises at least one notch corresponding to the gap.

Furthermore, a width of the through hole is less than a width of the first metal layer, and the width of the through hole is less than a width of the second metal layer.

Furthermore, the second metal layer comprises at least one protrusion and a second metal body layer, the second metal layer is disposed on the first metal layer and is attached to a lateral side of the through hole, and the protrusion is defined on the gate insulating layer.

Furthermore, the lateral circuit comprises a metal-printed layer disposed on a lateral side of the array substrate, a conductive adhesive layer attached to a side of the metal-printed layer, and a chip on film (COF) attached to a side of the conductive adhesive layer away from the metal-printed layer.

Furthermore, the metal-printed layer is a silver-line-printed circuit, and the conductive adhesive layer comprises a plurality of conductive particles and a resin adhesive.

Regarding the beneficial effects: the present disclosure provides a bonding structure of a lateral side of a display panel. By defining a through hole in a gate insulating layer, a second metal layer and a first metal layer may be directly connected to each other, thereby reducing layers flaked off from a glass when a lateral side of the glass is edged. Furthermore, by adjusting a size of the through hole, the second metal layer may cover the first metal layer so that the first metal layer may be protected when the second metal layer is etched. In addition, a passivation layer is disposed between a circuit under the glass and a transparent electrode of a color filter, which may effectively isolate a gold-ball adhesive and a conductive layer, thereby solving a problem that a short circuit is easy to occur in the circuit under the glass.

BRIEF DESCRIPTION OF THE SEVERAL VIEWS OF THE DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which those skilled in the art can derive further figures without making any inventive efforts.

DETAILED DESCRIPTION OF SPECIFIC EMBODIMENTS OF THE INVENTION

Figure 1:
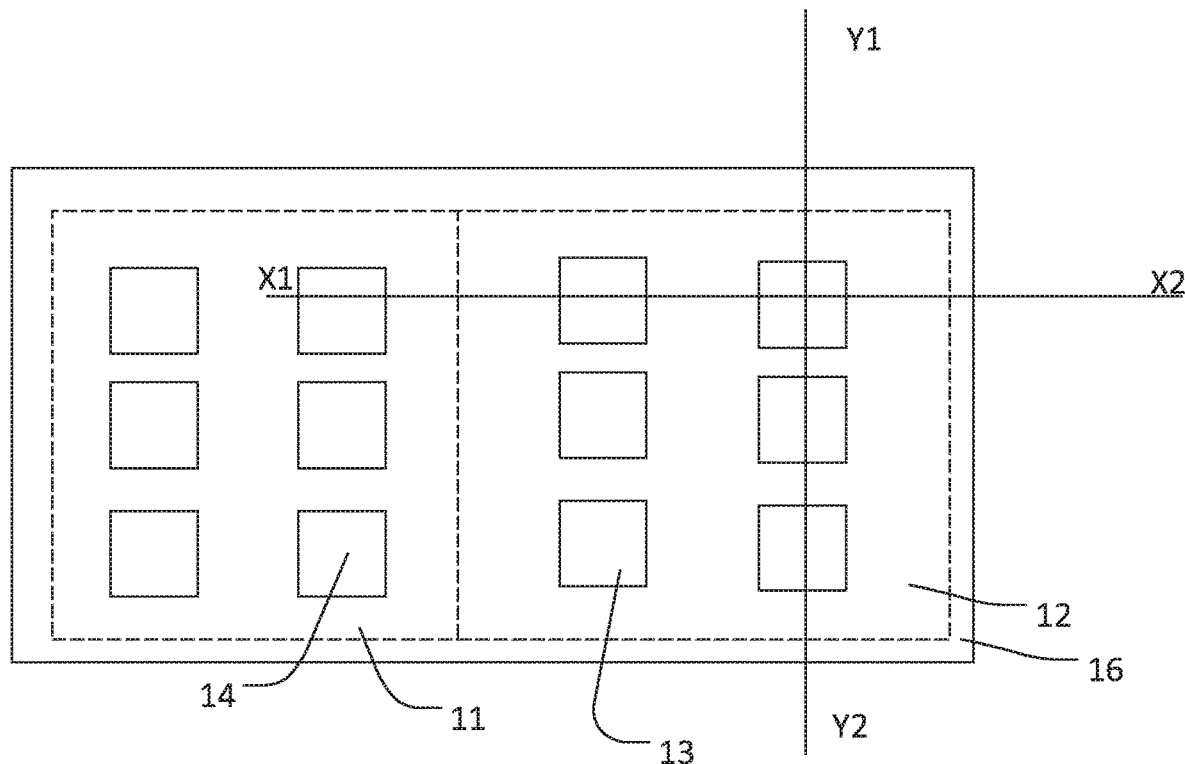
FIG. 1 is a schematic plan diagram showing a circuit under a glass according to a conventional technology.
Figure 2:
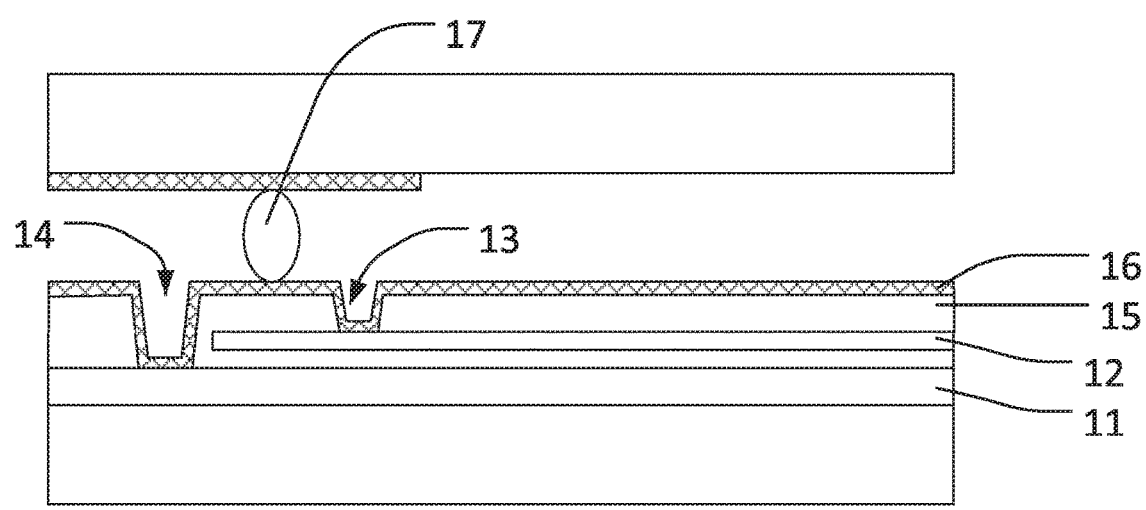
FIG. 2 is a sectional schematic structural diagram taken along line Y1-Y2 in FIG. 1.
Figure 3:
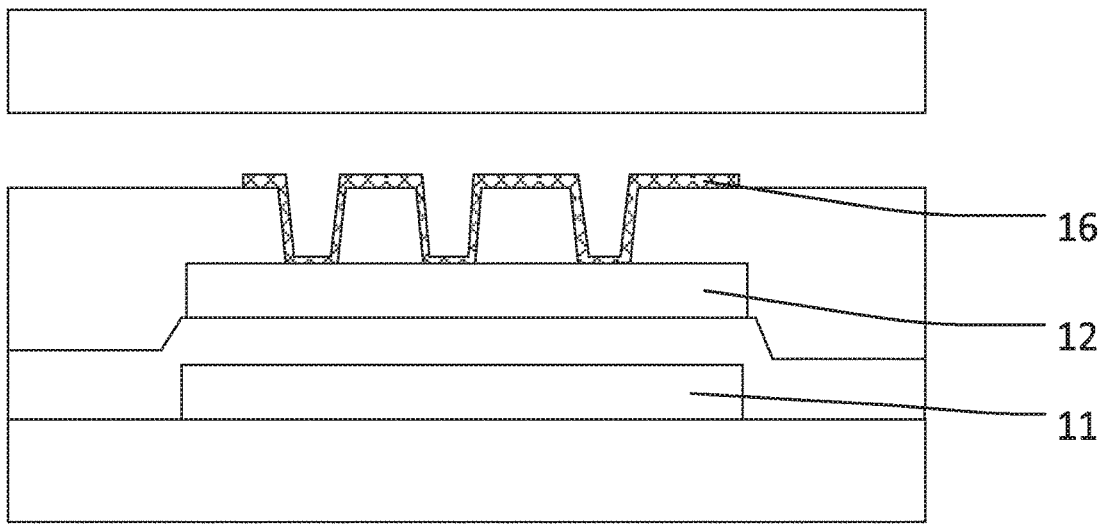
FIG. 3 is a sectional schematic structural diagram taken along line X1-X2 in FIG. 1.

The following description of the various embodiments is provided with reference to the accompanying drawings. It should be understood that terms such as "upper", "lower", "front", "rear", "left", "right", "inside", "outside", "lateral", as well as derivative thereof should be construed to refer to the orientation as then described or as shown in the drawings under discussion. Thus, features limited by "first" and "second" are intended to indicate or imply including one or more than one these features. In the drawings, the identical or similar reference numerals constantly denote the identical or similar elements or elements having the identical or similar functions.

Examples of the described embodiments are given in the accompanying drawings, and the specific embodiments described with reference to the accompanying drawings are all exemplary and are intended to interpret the practical application of the present disclosure, which shall not be construed as causing limitations to the present disclosure. Therefore, those skilled in the art can understand the described embodiments and modifications to the described embodiments.

Figure 4:
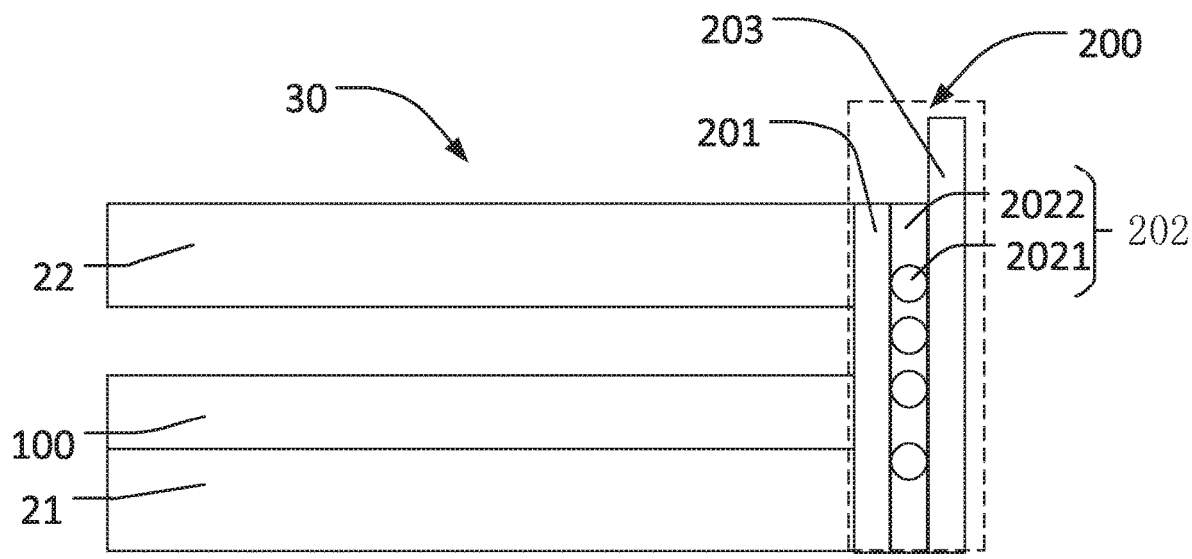
FIG. 4 is a schematic structural diagram showing a bonding structure of a lateral side of a display panel according to the present disclosure.

As shown in FIG. 4, a bonding structure 30 of a lateral side of a display panel provided by the present disclosure includes an array substrate 21, a color filter 22, an inner circuit 100, and a lateral circuit 200.

The array substrate 21 is disposed opposite to the color filter 22. A transparent electrode is disposed on a side of the color filter 22 near the array substrate 21.

Figure 5:
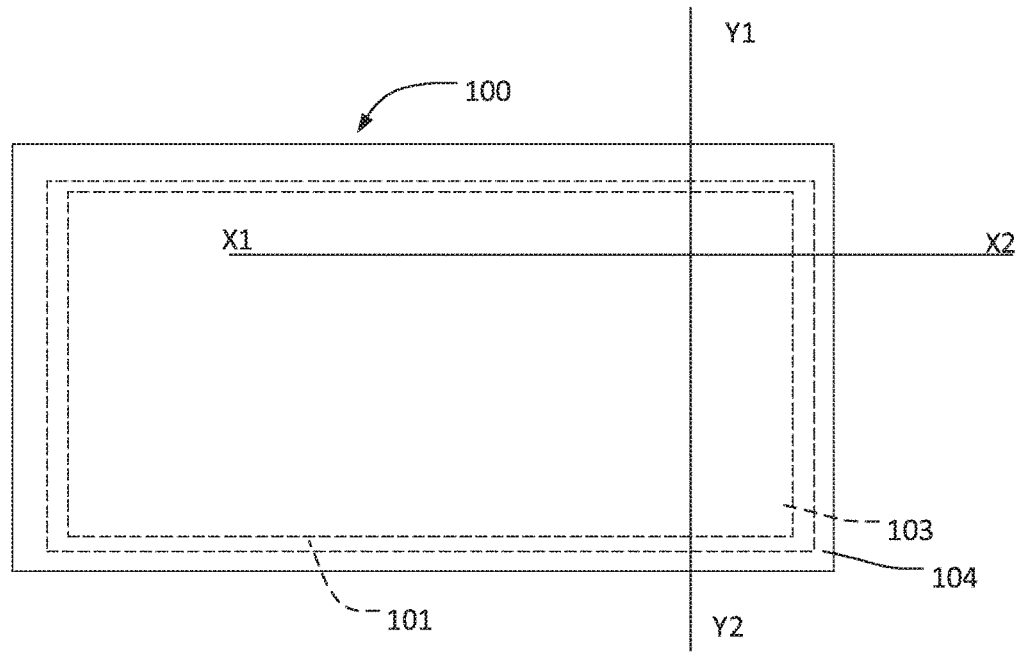
FIG. 5 is a schematic plan diagram showing an inner circuit according to a first embodiment of the present disclosure.
Figure 6:
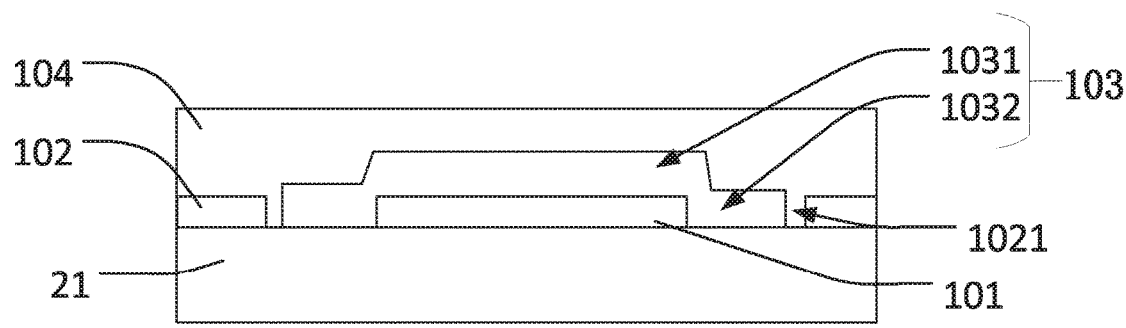
FIG. 6 is a vertical sectional diagram taken along line Y1-Y2 in FIG. 5 according to the first embodiment of the present disclosure.

The inner circuit 100 of a first embodiment may be referred to FIG. 5 and FIG. 6. The inner circuit 100 is disposed on the array substrate 21 and includes a first metal layer 101, a second metal layer 103, a passivation layer 104, and a gate insulating layer 102. The second metal layer 103 is disposed on the first metal layer 101 and is directly connected to the first metal layer 101.

The first metal layer 101 is disposed on the array substrate 21.

The gate insulating layer 102 is disposed on the array substrate 21 and the first metal layer 101. The gate insulating layer 102 is disposed on the first metal layer 101 and includes a through hole 1021. The through hole 1021 extends through the first metal layer 101 and reaches a surface of the first metal layer 101, and the second metal layer 103 is directly connected to the first metal layer 101 by the through hole 1021.

A width of the through hole 1021 is greater than a width of the first metal layer 101, and the width of the through hole 1021 is greater than a width of the second metal layer 103.

The second metal layer 103 includes at least one barrier 1032 and a second metal body layer 1031, and the at least one barrier 1032 is connected to the second body layer 1031.

The second metal body layer 1031 is disposed on the first metal layer 101, and the barrier 1032 is disposed in the through hole 1021 and is attached to a lateral side of the first metal layer 101.

Therefore, the second metal layer 103 may cover the first metal layer 101 by the second metal body layer 1031 and the barrier 1032, thereby protecting the first metal layer 101 and preventing the first metal layer 101 from being etched when the second metal layer 103 is etched.

The passivation layer 104 is disposed on the gate insulating layer 102 and the second metal layer 103.

The lateral circuit 200 is perpendicular to the array substrate 21 and is connected to the inner circuit 100. The lateral circuit 200 includes a metal-printed layer 201, a conductive adhesive layer 202, and a chip on film (COF) 203.

The metal-printed layer 201 is disposed on a lateral side of the array substrate 21 and is attached to lateral sides of the array substrate 21, the inner circuit 100, and the color filter 22. The metal-printed layer 201 is a silver-line-printed circuit.

The conductive adhesive layer 202 is attached to the metal-printed layer 201 and includes a plurality of conductive particles 2021 and a resin adhesive 2022.

The COF 203 is attached to a side of the conductive adhesive layer 202 away from the metal-printed layer 201. The lateral circuit 200 may transmit integrated circuit signals of the COF 203 to the inner circuit 100 to display images on a panel.

In the present disclosure, the first metal layer 101 is not connected to the second metal layer 103 by the transparent electrode. Instead, the first metal layer 101 and the second metal layer 103 are directly connected to each other. In a process of manufacturing narrow frames, metal balls in a metal-ball adhesive are compressed into the inner circuit 100 and are isolated from the metal layers by the passivation layer 104 so that the metal balls will not be connected to the metal layers. As a result, a short circuit problem is solved.

Figure 7:
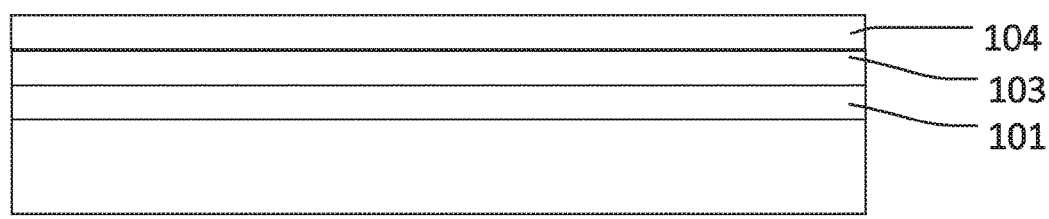
FIG. 7 is a horizontal sectional diagram taken along line X1-X2 in FIG. 5 according to the first embodiment of the present disclosure.

As shown in FIG. 7, a structure of layers provided by the present disclosure does not include a concave-convex surface, and the first metal layer 101 is connected to the second metal layer 103, thereby reducing layers flaked off from a glass when a lateral surface of the glass is edged.

The present disclosure provides the bonding structure 100 of a lateral side of a display panel. By defining the through hole 1021 in the gate insulating layer 102, the second metal layer 103 and the first metal layer 101 may be directly connected to each other, thereby reducing layers flaked off from the glass when the lateral side of the glass is edged. Furthermore, by adjusting the size of the through hole 1021, the second metal layer 103 may cover the first metal layer 101 so that the first metal layer 101 may be protected when the second metal layer 103 is etched. In addition, the inner circuit 100 is isolated from the transparent electrode of the color filter 22 by the passivation layer 104. Therefore, in a process of manufacturing narrow frames, metal balls in the metal-ball adhesive are compressed into the inner circuit 100 and are isolated from the metal layers by the passivation layer 104 so that the metal balls will not be connected to the metal layers. As a result, a short circuit problem is solved.

Figure 8:
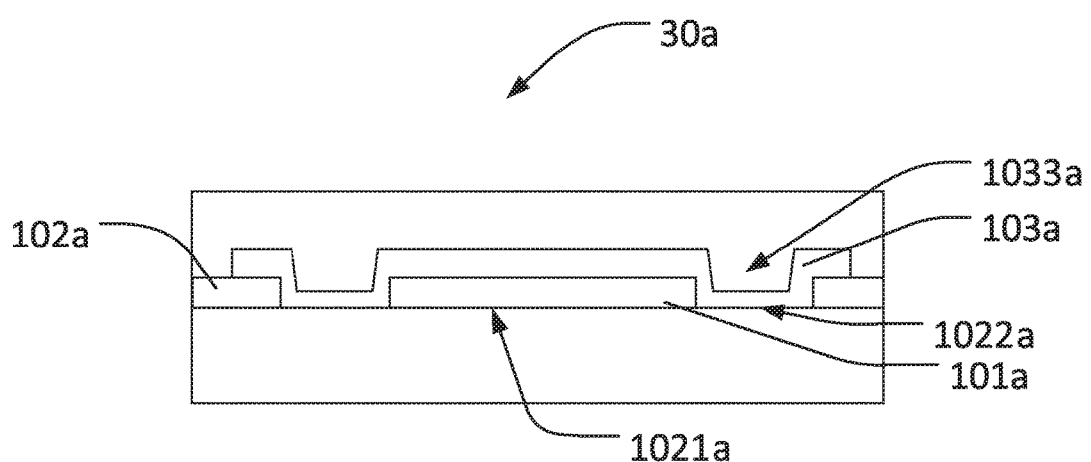
FIG. 8 is a vertical sectional diagram showing an inner circuit according to a second embodiment of the present disclosure.

As shown in FIG. 8, a second embodiment of the present disclosure further provides a bonding structure 30a of a lateral side of a display panel. Differences between the first embodiment and the second embodiment are: in the second embodiment, a width of a through hole 1021a is greater than a width of a first metal layer 101a, and the width of the through hole 1021a is less than a width of the second metal layer 103a.

A gap 1022a is defined beside a lateral side of the first metal layer 101a away from the through hole 1021a. The second metal layer 103a is disposed on a gate insulating layer 102a and the first metal layer 101a and fills the gap 1022a. The second metal layer 103a includes at least one notch 1033a corresponding to the gap 1022a.

Compared to the first embodiment, in the second embodiment, a contact area between the second metal layer 103a and the gate insulating layer 102a is enlarged so that a contact area between the second metal layer 103a and layers is enlarged as well. Therefore, layers flaked off from a glass may be reduced when a lateral side of the glass is edged.

Figure 9:
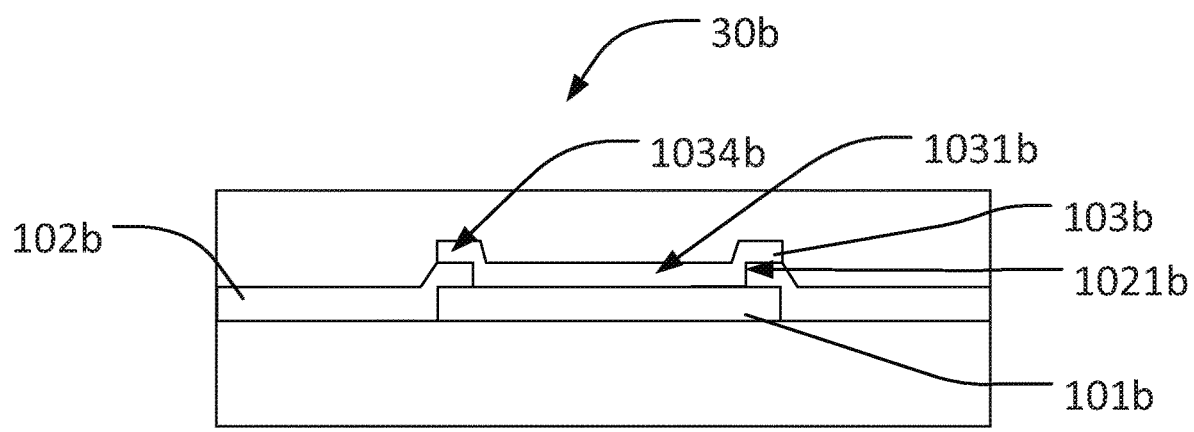
FIG. 9 is a vertical sectional diagram showing an inner circuit according to a third embodiment of the present disclosure.

As shown in FIG. 9, a third embodiment of the present disclosure further provides a bonding structure 30b of a lateral side of a display panel. Differences between the first embodiment and the third embodiment are: in the third embodiment, a width of a through hole 1021b is less than a width of a first metal layer 101b so that a portion of a gate insulating layer 102b is disposed on the first metal layer 101b; the width of the through hole 1021b is less than a width of the second metal layer 103b so that at least one protrusion 1034b of the second metal layer 103b is disposed on the gate insulating layer 102b.

The second metal layer 103b includes at least one protrusion 1034b and a second metal body layer 1031b, and the at least one protrusion 1034b is connected to the second body layer 1031b.

The second metal body layer 1031b is disposed on the first metal layer 101b and is attached to a lateral side of the through hole 1021b. The protrusion 1034b is defined on the gate insulating layer 102b.

The preferred embodiments are not intended to limit the present disclosure, and it is understood that many changes and modifications to the described embodiments can be carried out without departing from the scope and the spirit of the disclosure that is intended to be limited only by the appended claims.

What is claimed is:

1. A bonding structure of a lateral side of a display panel, comprising: an array substrate and a color filter disposed opposite to the array substrate; an inner circuit disposed on the array substrate; and a lateral circuit perpendicular to the array substrate and connected to the inner circuit; wherein the inner circuit includes a first metal layer and a second metal layer, and the second metal layer is disposed on and directly connected to the first metal layer; wherein the inner circuit further comprises a passivation layer and a gate insulating layer; the gate insulating layer is disposed on the first metal layer and the array substrate, the gate insulating layer comprises a through hole, and the through hole exposes the first metal layer; the second metal layer is connected to the first metal layer by the through hole; and the passivation layer covers the gate insulating layer and the second metal layer; and wherein a width of the through hole is greater than a width of the first metal layer; and the width of the through hole is greater than a width of the second metal layer.

2. The bonding structure of a lateral side of a display panel of claim 1, wherein the second metal layer comprises at least one barrier and a second metal body layer; the second metal body layer is disposed on the first metal layer; and the barrier is disposed in the through hole and is attached to a lateral side of the first metal layer.

3. The bonding structure of a lateral side of a display panel of claim 1, wherein the lateral circuit comprises: a metal-printed layer disposed on a lateral side of the array substrate; a conductive adhesive layer attached to the metal-printed layer; and a chip on film (COF) attached to a side of the conductive adhesive layer away from the metal-printed layer.

4. The bonding structure of a lateral side of a display panel of claim 3, wherein the metal-printed layer is a silver-line-printed circuit.

5. The bonding structure of a lateral side of a display panel of claim 3, wherein the conductive adhesive layer comprises a plurality of conductive particles and a resin adhesive.

* * * * *